(12) United States Patent
Hsu

(10) Patent No.: US 7,420,271 B2
(45) Date of Patent: Sep. 2, 2008

(54) HEAT CONDUCTIVITY AND BRIGHTNESS ENHANCING STRUCTURE FOR LIGHT-EMITTING DIODE

(75) Inventor: Hsin Fen Hsu, Hsinchu (TW)

(73) Assignee: Tsung Hsin Chen, Chiayi County (TW)

( * ) Notice: Subject to any disclaimer, the term of this patent is extended or adjusted under 35 U.S.C. 154(b) by 0 days.

(21) Appl. No.: 10/781,888

(22) Filed: Feb. 20, 2004

(65) Prior Publication Data
US 2004/0222502 A1 Nov. 11, 2004

(30) Foreign Application Priority Data
Feb. 20, 2003 (TW) ............... 92202638 U

(51) Int. Cl.
*H01L 23/48* (2006.01)
(52) U.S. Cl. ............... 257/695; 257/81; 257/91; 257/99; 257/694; 257/E33.075
(58) Field of Classification Search ........ 257/81, 257/91, 99, 679, 694, 695, E33.075; 313/499
See application file for complete search history.

(56) References Cited
U.S. PATENT DOCUMENTS
3,676,668 A * 7/1972 Collins et al. ............ 313/499
6,060,729 A * 5/2000 Suzuki et al. ............ 257/99
6,476,549 B2 * 11/2002 Yu ............... 313/499
6,710,373 B2 * 3/2004 Wang ........... 257/79

\* cited by examiner

*Primary Examiner*—Howard Weiss
*Assistant Examiner*—John C Ingham
(74) *Attorney, Agent, or Firm*—Troxell Law Office, PLLC

(57) ABSTRACT

A heat conductivity and brightness enhancing structure for light-emitting diode, including a bracket having a cathode leg support. A bowl structure is formed on upper end of the cathode leg support for resting a light-emitting chip therein. At least one depression is formed on a bottommost section of the bowl for receiving an adhesive therein. The depression has a diameter or area smaller than the bottom face of the chip. The adhesive is filled into the depression for adhering one or more chip. The other portions of the bottom face of the bowl, which contact with the chip is free from the adhesive and can achieve good heat conduction and radiation effect. At least one column hole is formed in the cathode leg support from a hollow section of the bottom of the bracket to the depression of the bowl. During manufacturing procedure, the adhesive can be heated, molten and exhausted from the column hole. The column hole serves as a passage for air convection, whereby the heat generated by the chip can be dissipated.

18 Claims, 8 Drawing Sheets

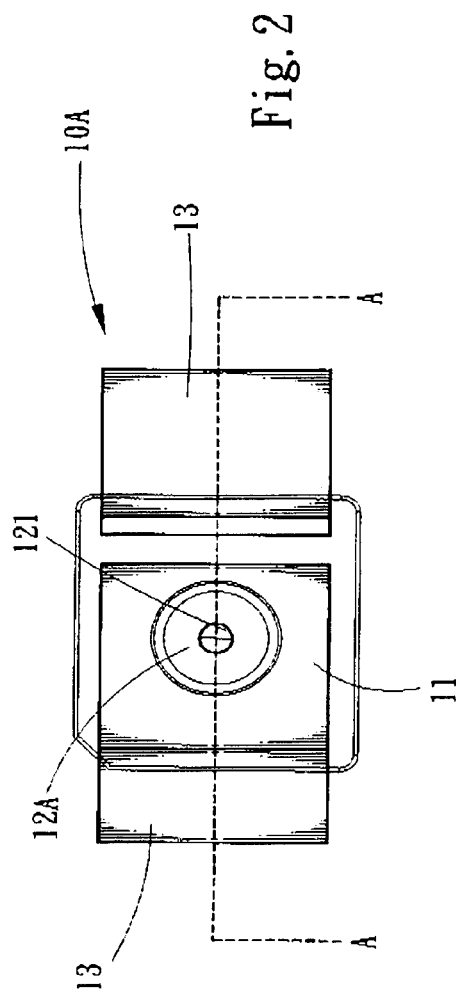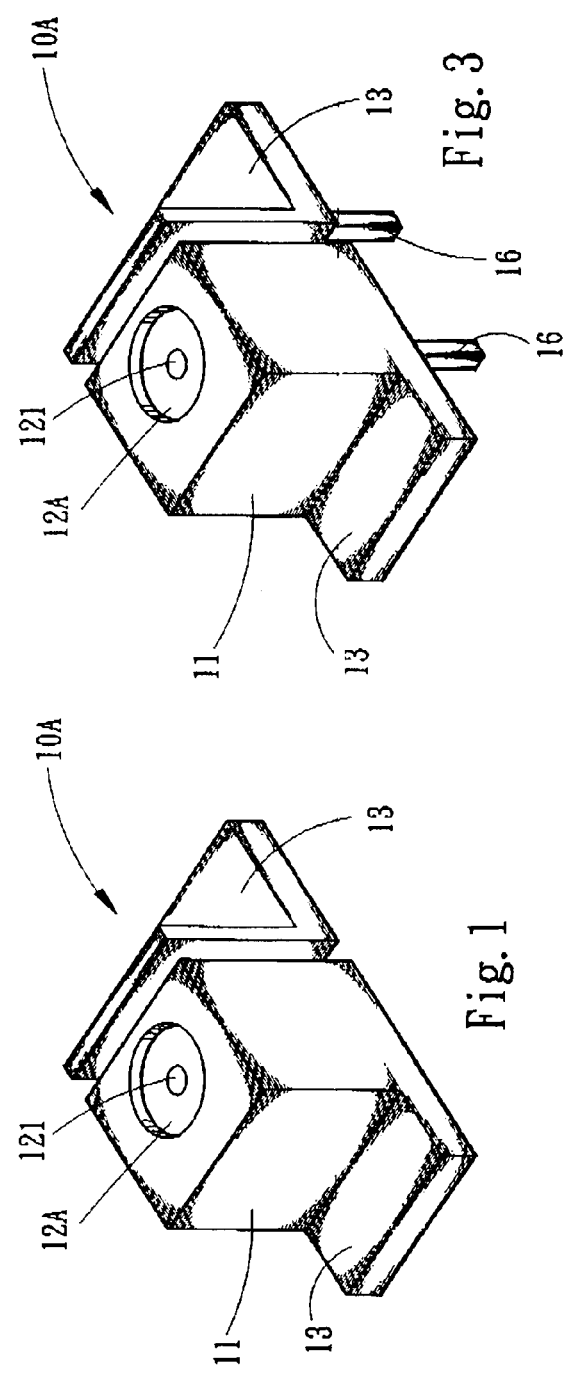

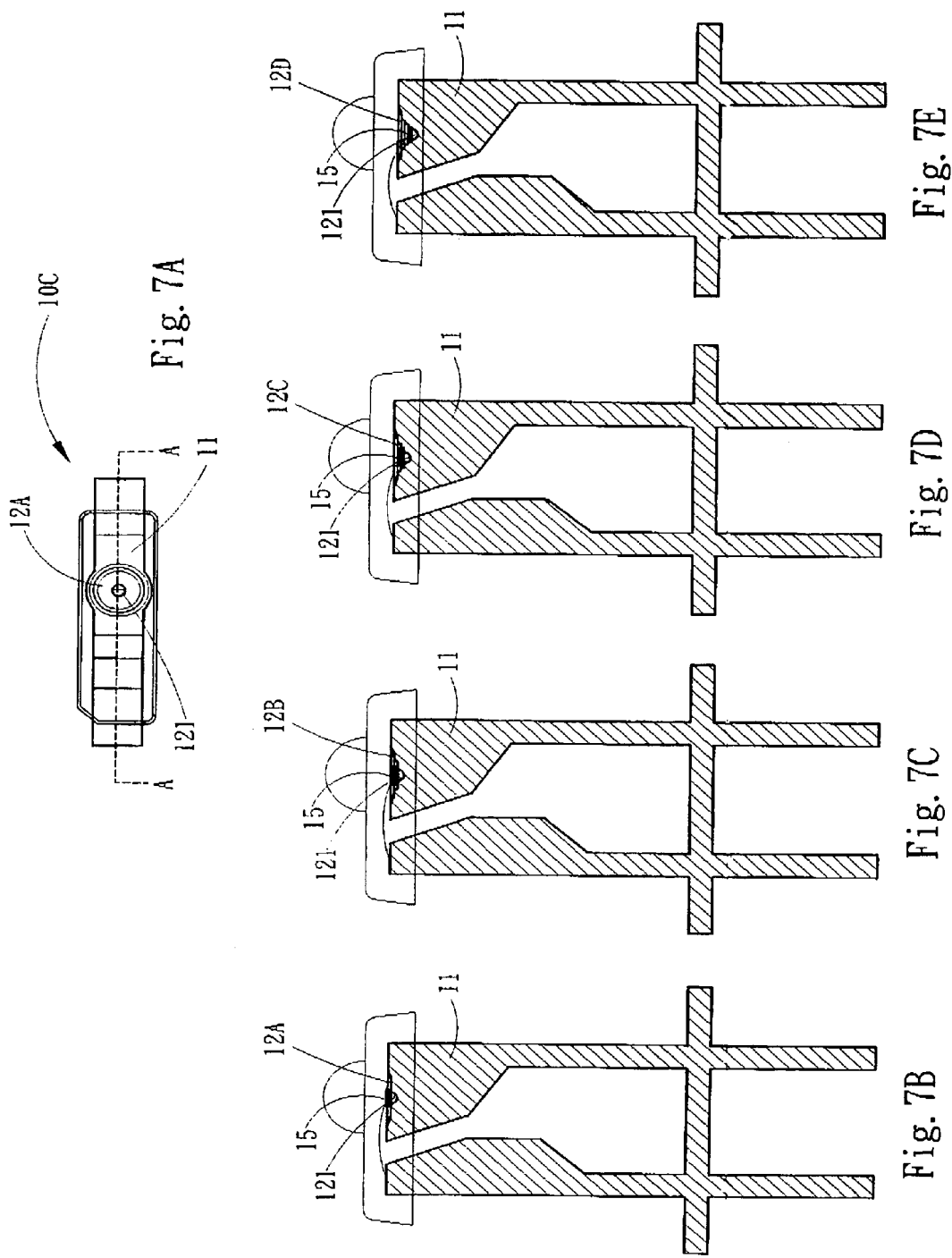

HEAT CONDUCTIVITY AND BRIGHTNESS ENHANCING STRUCTURE FOR LIGHT-EMITTING DIODE

BACKGROUND OF THE INVENTION

The present invention is related to an improved heat conductivity and brightness enhancing structure for light-emitting diode. An improved bowl structure is formed on upper end of the cathode leg support, whereby heat-radiation and light-focusing effects are enhanced. Accordingly, the brightness, quality, reliability and using life of the light-emitting diode can be greatly enhanced to save energy.

The conventional light-emitting diode bracket includes a cathode contact pin made of metal plate and an anode contact pin made of another metal plate. The upper end of the cathode contact pin is former with a recess in which a chip is fixed. Such structure is disclosed in Taiwanese Patent Publication No. 506626, entitled "light-emitting diode structure", Taiwanese Patent Publication No. 488616, entitled "light-emitting diode bracket", Taiwanese Patent Publication No. 486153, entitled "light-emitting diode bracket", Taiwanese Patent Publication No. 441860, entitled "light-emitting diode bracket structure".

Taiwanese Patent Publication No. 506626 discloses a light-emitting diode structure in which at least one light-emitting diode chip is disposed on upper end of the cathode contact pin. The light-emitting diode chip is connected to upper end of an anode contact pin via a conductive wire. The upper ends of the cathode and anode contact pins are packaged with a gum body. This light-emitting diode structure is characterized in that the gum body is a cylindrical body with a convex top face.

Taiwanese Patent Publication No. 488616 discloses a light-emitting diode bracket. A conductive metal plate is continuously punched to form multiple bracket units connected with each other and arranged at equal intervals. Each bracket unit includes a connecting section and a central section opposite thereto. The connecting section serves to connect with a conductive wire. The central section has a rest seat extending toward the connecting section for fixing a chip on the rest seat. Two ends of the connecting section and central section further outward extend to form a first, a second, a third and a fourth contact pins for connecting with a circuit. The heat generate by the chip when working can be quickly dissipated through the contact pins so as to enhance the heat-radiating efficiency of the light-emitting diode.

Taiwanese Patent Publication No. 486153 discloses a light-emitting diode bracket. A conductive metal plate is continuously punched to form multiple bracket units connected with each other and arranged at equal intervals. Each bracket unit includes a first contact pin and a second contact pin opposite to each other. An upper end of the first contact pin is formed with a first contact point for connecting with a first conductive wire. An upper end of the second contact pin is formed with a recess for fixing the chip therein. This bracket is characterized in that a second contact point further upward extends from outer side of the recess for connecting with a second conductive wire. The other ends of the first and second conductive wires can be respectively connected to the chip.

Taiwanese Patent Publication No. 441860 discloses a light-emitting diode bracket structure which is integrally formed of metal material such as copper or iron. A bowl structure is formed on top section of the bracket. The bottom of the bowl has a plane rest face for resting a light-emitting chip thereon. An inclined wall face obliquely upward extends from the periphery of the rest face for upward reflecting the light beam of the chip. This bracket structure is characterized in that at a height higher than the rested chip, the inclined wall face is perpendicularly converged toward the top end of the bowl to form a light focusing section.

In all the above prior arts, the upper end of the bracket of the conventional LED lamp is packaged with a transparent body. In addition, the bottom area of the bowl is entirely covered by an adhesive glue (such as silver glue, white glue and insulating glue) with a thickness of about 20 µm~100 µm for adhering the LED chip. The transparent body and the adhesive glue hinder the generated heat from being conducted and dissipated. When turned on, different LED chips with different powers will proportionally generate different heat quantities. It is critical to the lighting effect of the light-emitting diode whether the heat can be quickly conducted and dissipated. However, the adhesive glue painted on the bottom and the resin (A, B gum) packaged on the upper and lateral sections tightly enclose the chip into a big sealed body. The sealed body is much larger than the chip material. As a result, the brightness, quality, efficiency and using life of the light-emitting diode lamp are deteriorated. Therefore, it is tried by the applicant to provide an improved heat conductivity and brightness enhancing structure for light-emitting diode to solve the above problems.

SUMMARY OF THE INVENTION

It is therefore a primary object of the present invention to provide an improved heat conductivity and brightness enhancing structure for light-emitting diode. The bowl structure formed on upper end of, the cathode contact pin is modified so as to minify the contact area of the adhesive painted between the chip and the bottom of the bowl. The depth of the adhesive is about 20 µm~100 µm. The area is about 5%~95% the area of the bottom face of the chip and preferably about 15%~35% the area of the bottom face of the chip. At least one depression is formed on a bottommost section of the bowl. The depression has an area smaller than the bottom face of the chip. The depression can be circular, square, rectangular, lozenge, etc. The adhesive is filled in the depression for adhering at least one chip, whereby the bottom face of the chip directly contacts with the other portions of the bottom of the bowl, which are free from the adhesive. Accordingly, when the light-emitting chip is turned on, the heat generated by the chip can be directly conducted to the cathode leg support to enhance heat-radiating effect.

In addition, at least one column hole is formed through the cathode leg support from the depression of the bowl to outer side of the bracket. By means of the column hole, during baking procedure, the low melting point adhesive is molten into a liquid state and exhausted from the column hole. Accordingly, when the light-emitting chip is turned on, convection between internal air and external cold air will immediately take place through the column hole to directly and more quickly dissipate the heat. Therefore, the bracket with the bowl design can achieve high efficiency heat-radiating effect.

It is a further object of the present invention to provide the above heat conductivity and brightness enhancing structure for light-emitting diode. The bowl structure is formed with multistage recessed faces to provide multiple focusing and multiple refracting effects. In addition, the area of the light beam is doubled and the projecting length of the light beam is doubled. By means of such multistage bowl design, high efficiency optical physical effect can be achieved.

It is still a further object of the present invention to provide the above heat conductivity and brightness enhancing structure for light-emitting diode in which the bracket can have lateral heat-radiating wings or free from any heat-radiating wing. Alternatively, the bottom of the bracket can be entirely or partially at ached to the metal film of the PC board. Still alternatively the bottom of the bracket is partially attached to the metal film of the PC board, partially suspended/hollow and partially formed with columns which have column holes (through holes and blind holes) and are passed through the PC board. The space pattern of the bracket can be varied in accordance with different usages and different requirements of different environments.

The present invention can be best understood through the following description and accompanying drawings wherein:

BRIEF DESCRIPTION OF THE DRAWINGS

FIG. 1 is a perspective view of a bracket of the present invention, Which is formed with one-stage bowl and two heat-radiating wings;

FIG. 2 is a top view of the bracket of FIG. 1 after packaged;

FIG. 3 is a perspective view according to FIG. 1, in which the bracket additionally has fixing posts;

FIG. 7A is a top view of the bracket of FIG. 6 after packaged;

FIG. 7B is a plane sectional view taken along line A-A of FIG. 7A,

FIG. 7C is a plane sectional view taken along line A-A of FIG. 7A, in which the bracket has two-stage bowl;

FIG. 7D is a plane sectional view taken along line A-A of FIG. 7A, in which the bracket has three-stage bowl; and FIG. 7E is a plane sectional view taken along line A-A of FIG. 7A, in which the bracket has four-stage bowl.

DETAILED DESCRIPTION OF THE PREFERRED ENIBODIIENTS

Figure 1A:
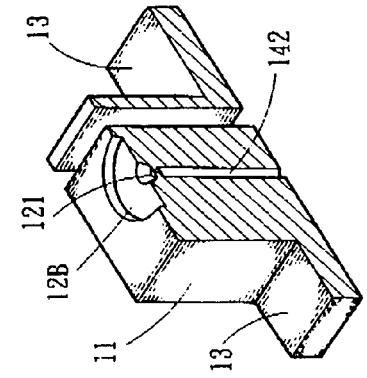
FIG. 1A is a perspective sectional view according to FIG. 1, showing the internal structure of the bracket of FIG. 1.
Figure 1B:
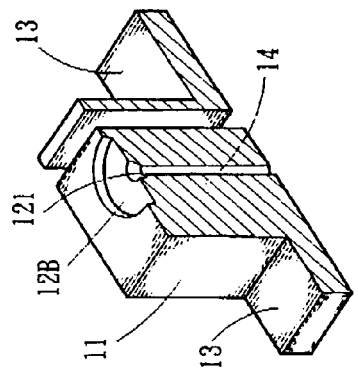
FIG. 1B is a perspective sectional view according to FIG. 1, showing the internal structure of the bracket of FIG. 1, which has a column hole.
Figure 1C:
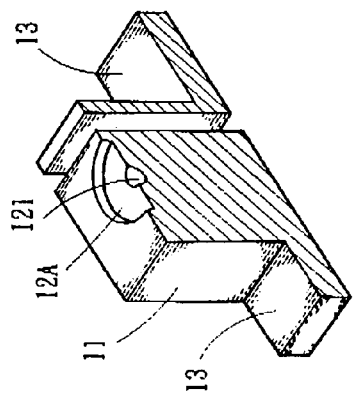
FIG. 1C is a perspective sectional view according to FIG. 1B, in which the column hole is a blind hole.
Figure 1D:
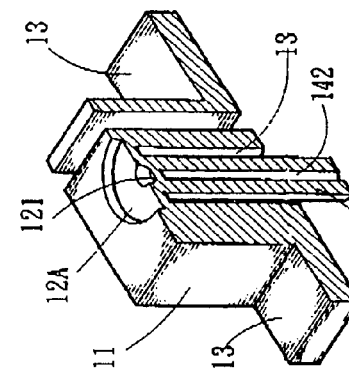
FIG. 1D is a perspective sectional view according to FIG. 1, showing the internal structure of the bracket of FIG. 1, which has column hole and hollow section.
Figure 1E:
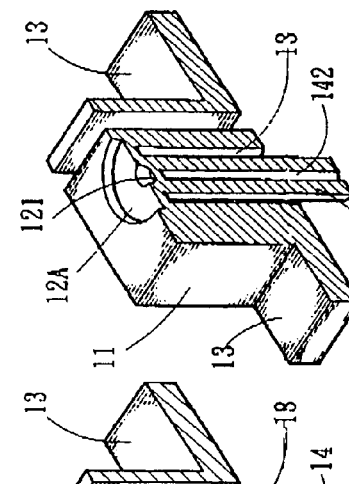
FIG. 1E a perspective sectional view according to FIG. 1D, in which the hollow section is not communicated with the depression through the column hole.
Figure 1F:
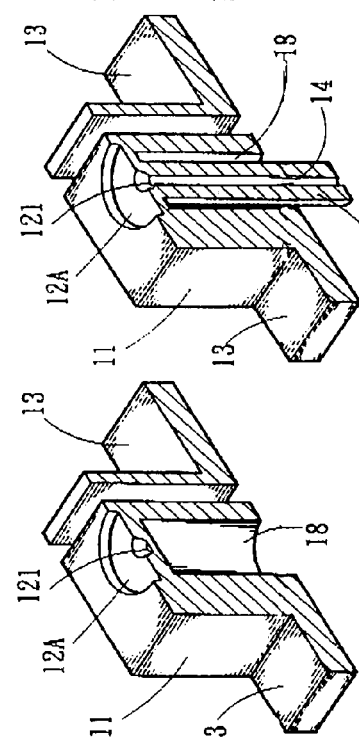
FIG. 1F is a perspective sectional view according to FIG. 1, showing the internal structure of the bracket of FIG. 1, which has column holes hollow section and a column formed with column hole.
Figure 1G:
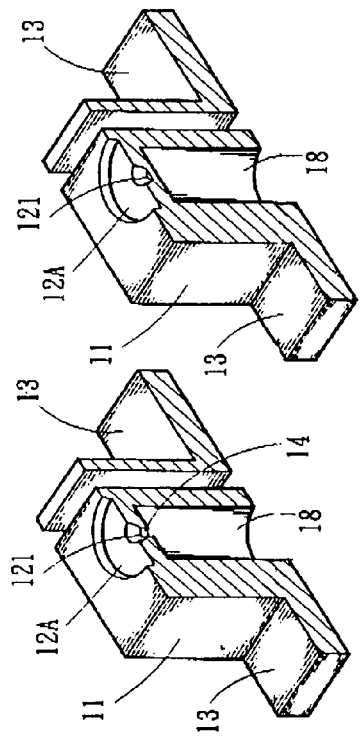
FIG. 1G is a perspective sectional view according to FIG. 1F, in which the column hole is a blind hole.
Figure 1H:
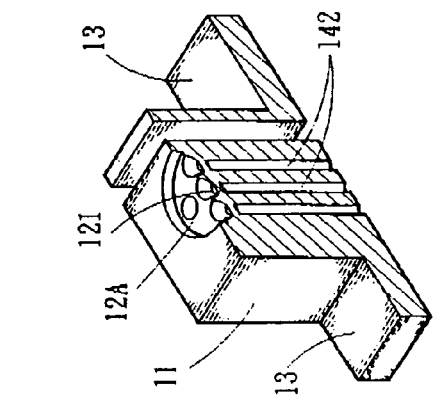
FIG. 1H shows that the bowl of the present invention is formed with concentric recesses.
Figure 1I:
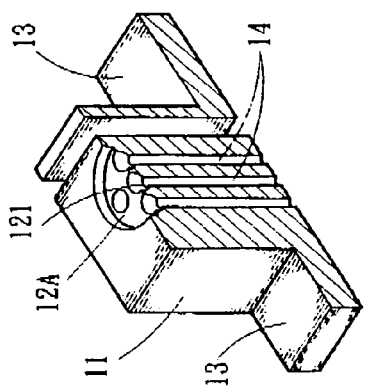
FIG. 1I is a perspective sectional view of a bracket having multiple internal column holes.
Figure 1J:
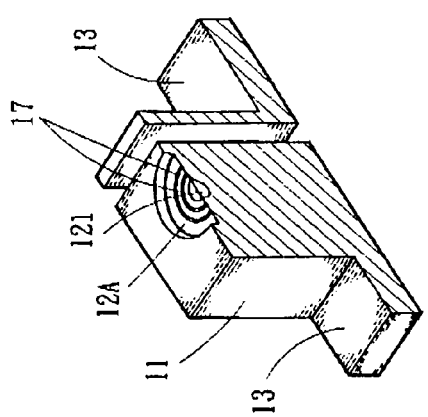
FIG. 1J is a perspective sectional view according to FIG. 1I, in which the column holes are blind holes.
Figure 1K:
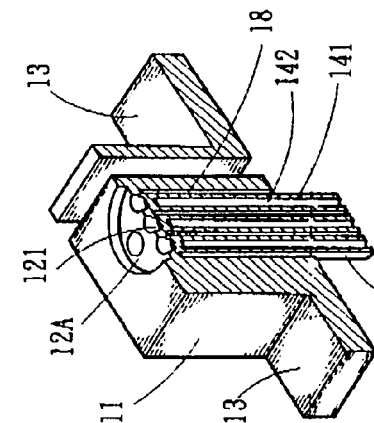
FIG. 1K is a perspective sectional view of a bracket having multiple internal column holes and hollow section.
Figure 1L:
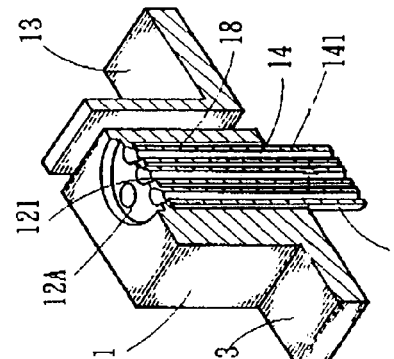
FIG. 1L is a perspective sectional view according to FIG. 1K, in which the hollow section is not communicated with the depression through the column holes.
Figure 1M:
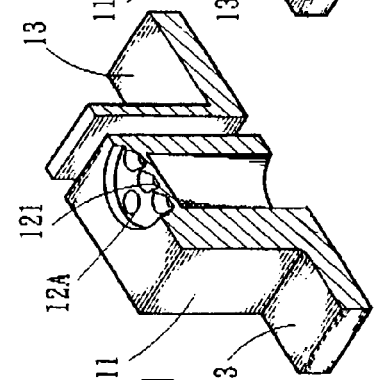
FIG. 1M is a perspective sectional of a bracket having multiple column holes, hollow section and columns formed with column holes.
Figure 1N:
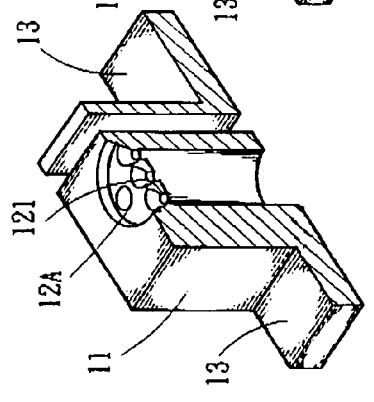
FIG. 1N is a perspective sectional view according to FIG. 1M, in which the column holes are blind holes.
Figure 2A:
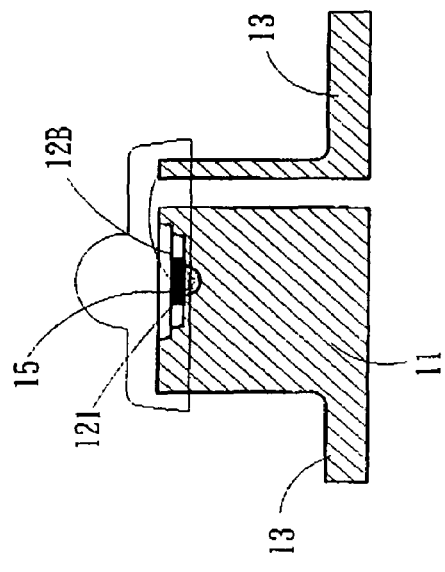
FIG. 2A is a plane sectional view taken along line A-A of FIG. 2.
Figure 2B:
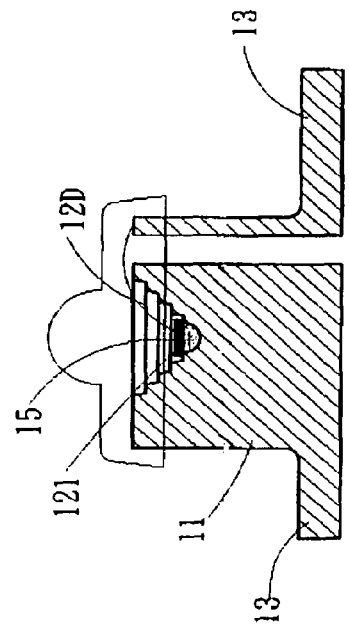
FIG. 2B is a plane sectional view of the bracket of the present invention, which has two-stage bowl.
Figure 2C:
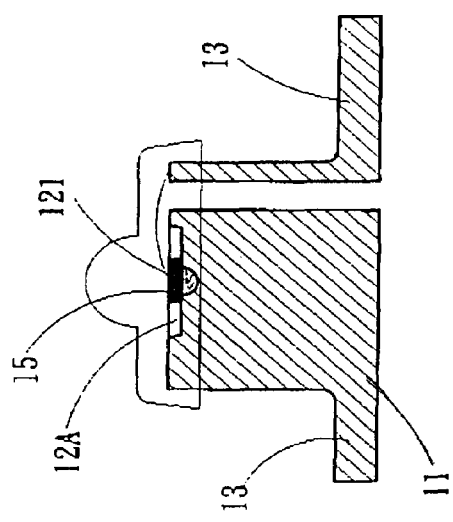
FIG. 2C is a plane sectional view of the bracket of the present invention, which has three-stage bowl.
Figure 2D:
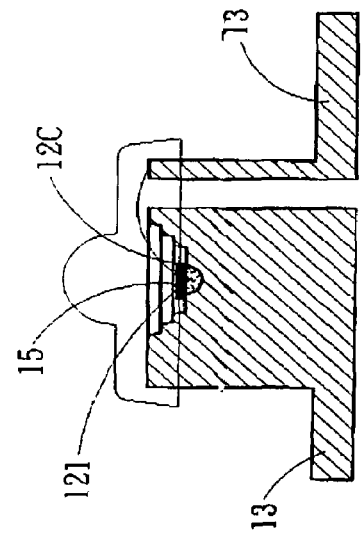
FIG. 2D is a plane sectional view of the bracket of the present invention, which has four-stage bowl.
Figure 4:
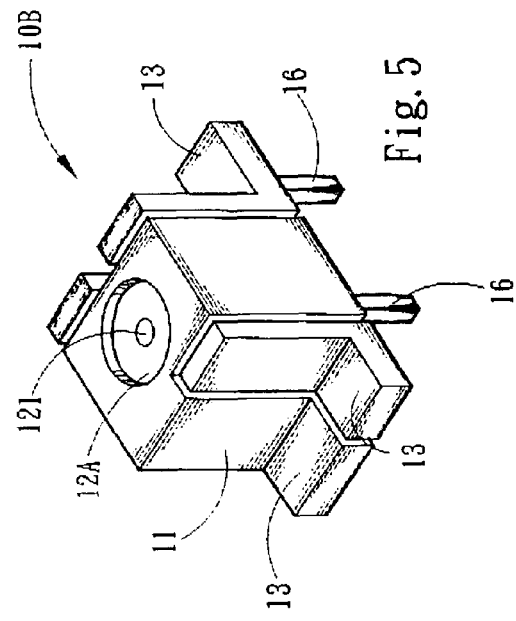
FIG. 4 is a perspective view of the bracket of the present invention, which has one-stage bowl and four heat-radiating wings.
Figure 4B:
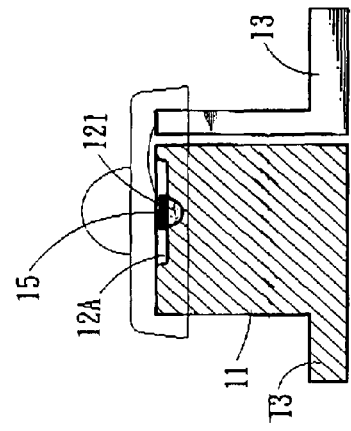
FIG. 4B is a plane sectional view taken along line A-A of FIG. 4A.
Figure 4A:
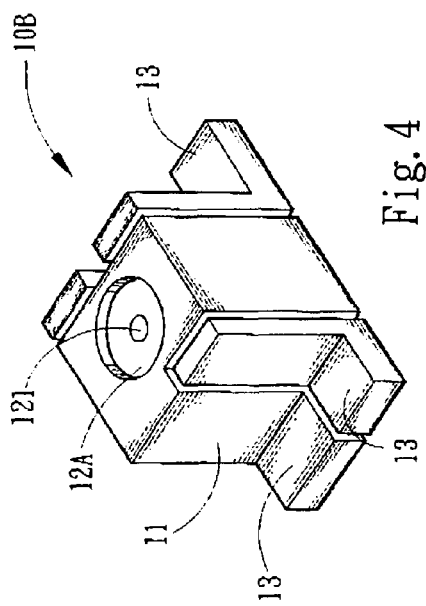
FIG. 4A is a top view of the bracket of FIG. 4 after packaged.
Figure 5:
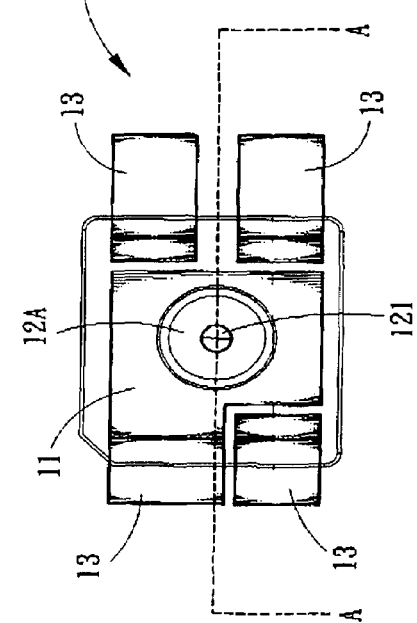
FIG. 5 is a perspective view according to FIG. 4, in which the bracket additionally has fixing posts-.
Figure 6A:
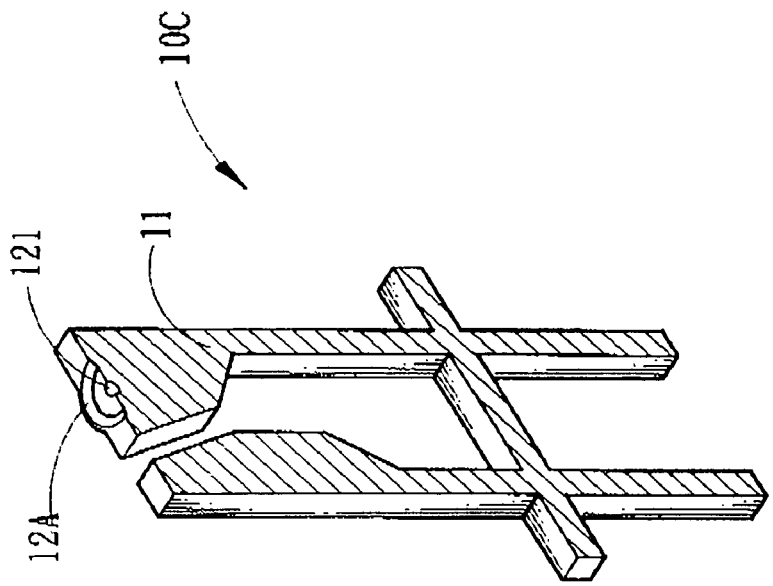
FIG. 6A is a perspective sectional view according to FIG. 6, showing the internal structure of the bracket of FIG. 6.
Figure 6:
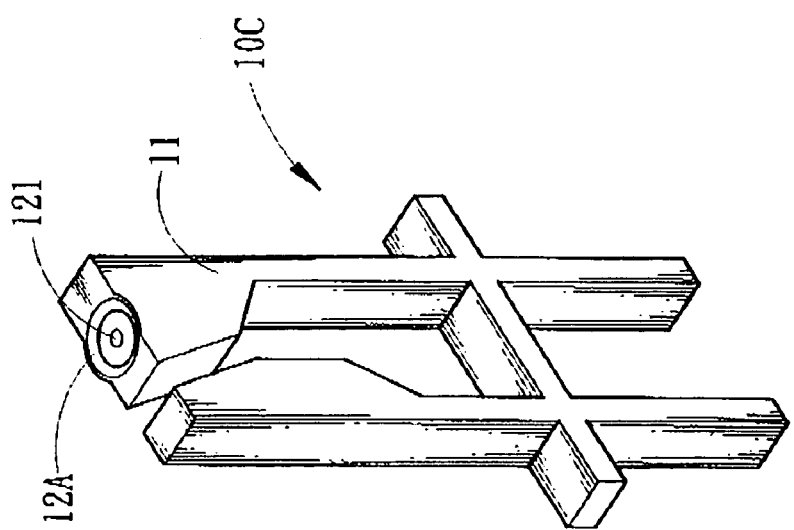
FIG. 6 is a perspective view of the bracket of the present invention, which has one-stage bowl and is free from any heat-radiating wing.
Figure 6B:
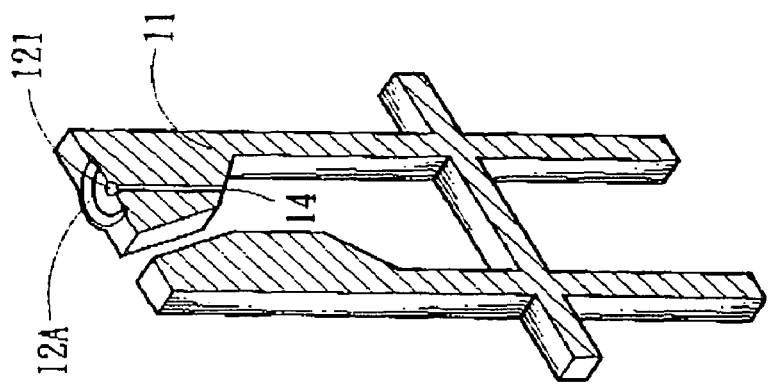
FIG. 6B is a perspective sectional view according to FIG. 6, showing the internal structure of the bracket of FIG. 6, which has a column hole.
Figure 6C:
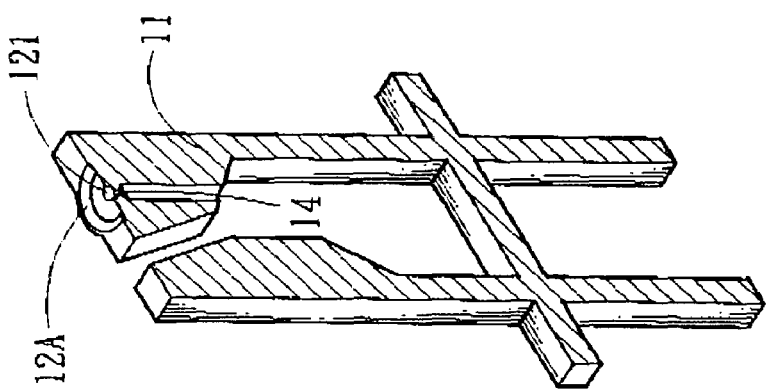
FIG. 6C is a perspective sectional view according to FIG. 6, showing another aspect of the internal structure.
Figure 6D:
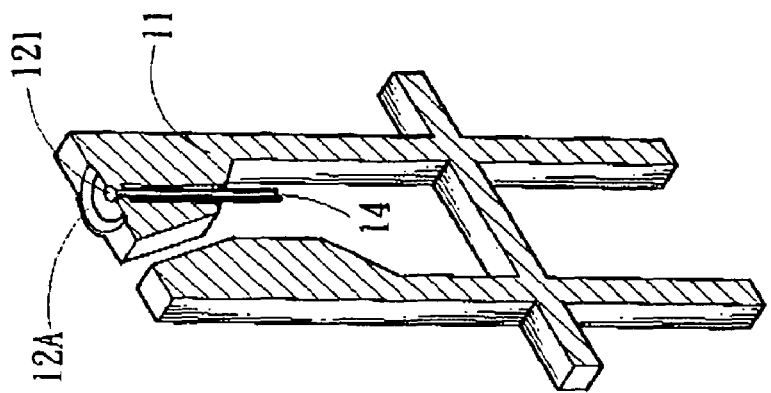
FIG. 6D a perspective sectional view according to FIG. 6, showing still another aspect of the internal structure.

Please refer to FIGS. 1 to 2D. The heat conductivity and brightness enhancing structure for light-emitting diode of the present invention provides a bowl 12A, 12B, 12C, 12D on the top end of a bracket 10A (with two heat-radiating wings), 10B (with four heat-radiating wings), 10C (without any heat-radiating wing) or other type of cathode leg support 11. A light-emitting chip 15 is rested in the bowl.

The bottommost section of the bowl 12A, 12B, 12C, 12D is formed with at least one depression 121. The depression 121 has a diameter or area smaller than bottom face of the light-emitting chip (preferably 15%~35% smaller than the bottom face of the chip). In a preferred embodiment, the depression has a diameter or area about 5%~95% smaller than the bottom face of the chip. The depression 121 can be circular, square, rectangular, lozenge, etc. The depth of the cross-section of the depression is determinable as necessary. Accordingly, an adhesive glue (such as silver glue, white glue, insulating glue, etc. or common heat conductive metal adhesive material such as aluminum, copper, silver, tin, etc.) can be filled into the depression 121. The adhesive material can be solid, liquid or paste with put the problem of poor heat radiation existing in the conventional adhesives. The adhesive serves to adhere one or more chips 15 without loosening or displacement. The adhesive can resist against the lulling force in soldering. Except the bottom section of the chip 15 corresponding to the depression 121, the bottom area of the chip 15 is free from the adhesive and possibly directly contacts with the bottom of the bowl. Preferably, over 50% bottom area of the chip 15 directly contacts with the bottom of the bowl. Accordingly, when the light-emitting chip 15 is turned on, through the contacting section free from the adhesive, the heat can be directly conducted to the bracket 10A, 10B, 10C.

In addition, referring to FIGS. 1C, 1F, 1G, IJ, 1L and 1N, the column hole 14 is formed as a column blind hole 142 directed to the bottom. A thin wall remains between the bowl and the blind hole 142. The heat generated by the chip 15 is first conducted to the cathode leg support 11 and the column blind hole 142 and then is dissipated by way of convection. Therefore, the heat-radiating effect is better.

Referring to FIGS. 1B to 1E and 6B to 6D, in a preferred embodiment, column hole 14 passes through the bracket 11 from the depression 11 of the bowl 12A, 12B, 12C, 12D of the cathode leg support 11 to the bottom of the bracket 11. Accordingly, the cathode leg support 11 becomes a hollow bracket having a column hole 14. By means of the column hole 14, when baked after the packaging step during processing procedure, the low melting point adhesive is molten into a liquid state and exhausted from the column hole 14. Accordingly, the entire depression 121 becomes open to outer side. When the light-emitting chip 15 is turned on, convection of air will immediately take place to directly dissipate the heat. In a not used state, impurities are prevented from being entrained by external air into the bracket to affect the chip 15. Accordingly, the bracket with the bowl design can achieve high efficiency heat-radiating effect.

Referring to FIGS. 2A to 2D, in a preferred embodiment, the bowl 12A, 12B, 12C, 12D of the cathode leg support 11 is designed with at least one concentric recess 17. This helps in alignment of the chip. Also, a proper amount of adhesive can be added according to the size of the chip to enhance the adhesion. There is one or more steps of recessed faces. For example, FIG. 2A shows a one-step bowl 12A, FIG. 2B shows a two-step bowl 12B, FIG. 20 shows a three-step bowl 12C and FIG. 2D shows a multi-step (four-step) bowl 12D. Accordingly, the bowl structure can provide multiple focusing and multiple refracting effects. In addition, the area of the light beam is doubled and the projecting length of the light beam is doubled. By means of the two-step, three-step, and multi-step bowl designs, high efficiency optical physical effect can be achieved to enhance the illumination.

Referring to the respective figures, the bracket of the present invention can have two heat-radiating wings 13 or four heat-radiating wings 13 according to different requirements. More than two fixing posts 16 can be disposed under the bottom of the bracket for insertion in a PC board. In the case that the cathode leg support 11 is free from any column hole 14, the bracket is a solid bracket. The bottom face of each solid bracket is fully attached to and contacts with the conductive metal film on the PC board to achieve better heat-radiating effect. Another type of cathode leg support 11 is formed with several column through holes 14 and has hollow structure 18 and is called a hollow bracket. Each hollow bracket is connected with the conductive metal film of the PC board by various measures. Some of them have less surface area attached to the PC board (as shown in FIGS. 1B and 1I). Some of them have a first bottom surface attached to the PC board and a second bottom surface suspended above the circuit board (as shown in FIGS. 1C to 1E and 1J to 1L). Some of them have a first bottom surface attached to the PC board and a second bottom surface suspended above the circuit board a column 141 passing through the PC board (as shown in FIGS. 1F, 1G, 1M, and 1N). The hollow bracket can achieve best heat-radiating effect.

At least one depression 121 is formed in the bowl 12A, 12B, 12C, 12D for receiving the adhesive (containing metal and nonmetal) for adhering the light-emitting chip 15. This can eliminate the shortcoming that the adhesive hinders the heat from being conducted. In addition, the column hole 14 or column blind hole 142 under the depression 121 communicates with outer side to achieve further heat dissipating effect by way of air convection. Furthermore, by means of the multistage recessed faces of the bowl 12A, 12B, 12C, 12D and the varied spaces of the bracket 10A (with two heat-radiating wings), bracket 10B (with four heat-radiating wings) and bracket 10C (free from any heat-radiating wing) and the internal through holes or blind holes or hollow sections, the heat-radiating effect can be effectively enhanced. Therefore, the brightness, quality, reliability and using life of light-emitting diode can be greatly enhanced.

The abode embodiments are only used to illustrate the present invention, not intended to limit the scope thereof. Many modifications of the above embodiments can be made without departing from the spirit of the present invention.

What is claimed is:

1. A heat conductivity and brightness enhancing structure for light-emitting diode comprising: a bracket having:
    a) a cathode leg support;
    b) a bowl formed in an upper end of the cathode leg support;
    c) a light-emitting chip located in the bowl; and
    d) at least one depression formed in a bottommost section of the bowl and receiving an adhesive therein, the at least one depression having an opening directed toward the chip, the opening having a diameter smaller than a bottom face of the chip, the adhesive filling the at least one depression and adhering the chip in the bowl, wherein a column hole is formed through the cathode leg support from at least one depression of the bowl to an outer side of the bracket.

2. The heat conductivity and brightness enhancing structure for light-emitting diode as claimed in claim 1, wherein the bowl has a recessed face having at least one step.

3. The heat conductivity and brightness enhancing structure for light-emitting diode as claimed in claim 1, wherein the circumference of the depression of the bowl is formed with concentric recesses.

4. The heat conductivity and brightness enhancing structure for light-emitting diode as claimed in claim 1, wherein at least one side of the bracket is formed with heat-radiating wings.

5. The heat conductivity and brightness enhancing structure for light-emitting diode as claimed in claim 1, wherein the bottom face of the bracket attached to a conductive metal film of a PC board.

6. The heat conductivity and brightness enhancing structure for light-emitting diode as claimed in claim 1, wherein the bottom face of the bracket is partially attached to a conductive metal film of a PC board.

7. The heat conductivity and brightness enhancing structure for light-emitting diode as claimed in claim 6, wherein the bottom face of the bracket is partially attached to a conductive metal film of a PC board and partially suspended.

8. The heat conductivity and brightness enhancing structure for light-emitting diode as claimed in claim 6, wherein the bottom face of the bracket is partially attached to a conductive metal film of a PC board, partially suspended and partially formed with columns which have column holes and are passed through the PC board.

9. The heat conductivity and brightness enhancing structure for light-emitting diode as claimed in claim 1, wherein at least two fixing posts are disposed under the bottom face of the bracket for insertion in a PC board.

10. A heat conductivity and brightness enhancing structure for light-emitting diode comprising: a bracket having:
    a) a cathode leg support;

b) a bowl formed in an upper end of the cathode leg support;

c) a light-emitting chip located in the bowl; and d) at least one depression formed in a bottommost section of the bowl and receiving an adhesive therein, the at least one depression having an opening directed toward the chip, the opening having a diameter smaller than a bottom face of the chip, the adhesive filling the at least one depression and adhering the chip in the bowl, wherein the bottom face of the bracket is partially attached to a conductive metal film of a PC board, wherein the bottom face of the bracket is partially attached to a conductive metal film of a PC board, partially suspended and partially formed with columns which have column holes and are passed through the PC board.

11. The heat conductivity and brightness enhancing structure for light-emitting diode as claimed in claim 10, wherein a column blind hole is formed in the cathode leg support from a portion below at least one depression of the bowl by a certain thickness to an outer side of the leg support.

12. The heat conductivity and brightness enhancing structure for light-emitting diode as claimed in claim 10, wherein at least two fixing posts are disposed under the bottom face of the bracket for insertion in the PC board.

13. A heat conductivity and brightness enhancing structure for light-emitting diode comprising: a bracket having:

a) a cathode leg support;

b) a bowl formed in an upper end of the cathode leg support;

c) a light-emitting chip located in the bowl; and d) at least one depression formed in a bottommost section of the bowl and receiving an adhesive therein, the at least one depression having an opening directed toward the chip, the opening having a diameter smaller than a bottom face of the chip, the adhesive filling the at least one depression and adhering the chip in the bowl, wherein the bottom face of the bracket is partially attached to a conductive metal film of a PC board, partially suspended and partially formed with columns which have column holes and are passed through the PC board.

14. The heat conductivity and brightness enhancing structure for light-emitting diode as claimed in claim 13, wherein the bowl has a recessed face having at least one step.

15. The heat conductivity and brightness enhancing structure for light-emitting diode as claimed in claim 13, wherein the circumference of the depression of the bowl is formed with concentric recesses.

16. The heat conductivity and brightness enhancing structure for light-emitting diode as claimed in claim 13, wherein at least one side of the bracket is formed with heat-radiating wings.

17. The heat conductivity and brightness enhancing structure for light-emitting diode as claimed in claim 13, wherein at least two fixing posts are disposed under the bottom face of the bracket for insertion in the PC board.

18. The heat conductivity and brightness enhancing structure for light-emitting diode as claimed in claim 13, wherein a column hole is formed through the cathode leg support from at least one depression of the bowl to an outer side of the bracket.

* * * * *